United States Patent [19]
Chen

[11] Patent Number: 5,453,406
[45] Date of Patent: Sep. 26, 1995

[54] ASPECT RATIO INDEPENDENT COATING FOR SEMICONDUCTOR PLANARIZATION USING SOG

[75] Inventor: Lai-Juh Chen, Hsin-chu, Taiwan, Prov. of China

[73] Assignee: Industrial Technology Research Institute, Hsin Chu, Taiwan, Prov. of China

[21] Appl. No.: 259,074

[22] Filed: Jun. 13, 1994

[51] Int. Cl.[6] .................................................. H01L 21/469
[52] U.S. Cl. ............................ 437/231; 437/225; 437/228
[58] Field of Search ..................................... 437/231, 225, 437/228

[56] References Cited

U.S. PATENT DOCUMENTS

| | | | |
|---|---|---|---|
| 3,198,657 | 8/1965 | Kimball et al. | 437/231 |
| 4,741,926 | 5/1988 | White et al. | 437/231 |
| 4,971,931 | 11/1990 | Weiss et al. | 437/231 |
| 5,003,062 | 3/1991 | Yen | 437/231 |
| 5,219,792 | 6/1993 | Kim et al. | 437/195 |
| 5,238,878 | 8/1993 | Shinohara | 437/231 |
| 5,254,497 | 10/1993 | Liu | 437/231 |
| 5,264,246 | 11/1993 | Ikeno | 437/231 |
| 5,320,983 | 6/1994 | Ouellet | 437/231 |

FOREIGN PATENT DOCUMENTS

| | | | |
|---|---|---|---|
| 0103728 | 8/1980 | Japan | 437/231 |
| 0087048 | 4/1991 | Japan | 437/231 |

*Primary Examiner*—Brian E. Hearn
*Assistant Examiner*—Lynne A. Gurley
*Attorney, Agent, or Firm*—George O. Saile

[57] ABSTRACT

A new method for forming a planarized dielectric layer on a patterned conducting layer was accomplished. The method involves forming a insulating layer over a semiconductor substrate having semiconductor devices formed therein. A metal conducting layer is deposited and then patterned by anisotropically etching. The patterned conducting layer is used to make the electrical connections to the device contact. A barrier insulator is deposited on the patterned conducting layer to keep the conducting layer from coming into contact with the spin-on-glass and eroding. A planar dielectric layer is formed over the patterned conducting layer by coating a first spin-on-glass layer at a constant and low speed and then baking and then a second spin-on-glass layer is coated on the first spin-on-glass layer at a constant and high speed and then cured forming an improved planarized dielectric layer.

21 Claims, 4 Drawing Sheets

ASPECT RATIO INDEPENDENT COATING FOR SEMICONDUCTOR PLANARIZATION USING SOG

BACKGROUND OF THE INVENTION

1. Field of the Invention

The present invention relates to the formation of planarized insulating layers on semiconductor substrates having irregular surface features and more particularly, to the use of a non-etchback spin-on-glass techniques for planarizing over micrometer and submicrometer surface features.

2. Description of the Prior Art

Today's Ultra Large Scale Integration (ULSI) on the semiconductor substrate are in part due to advances in photolithographic techniques and to advances in etching. For example, improvements in optical resolution and photoresist materials have lead to submicrometer resolution in photoresist image sizes. Likewise, the replacement of wet etching with directional plasma etching has resulted in submicrometer patterns being etched in the substrate and in the conducting and insulating layers that are deposited on the substrate surface and make up the integrated circuits.

However, the accumulated effect of depositing these layers and the etching of patterns in the layers, one on top of the other as resulted in irregular or substantially non-planar surface features on the otherwise microscopically planar substrate. This rough topography is substantially worse at the later processing step where multilayer metallurgy is used to wire up the discrete devices on the integrated circuit chip.

These advancements in down scaling of devices and inter-connecting metal wiring have not come without certain technological problems. For example, the improvement in photolithographic resolution require a more shallow depth of focus during optical exposure of the photoresist. This results in unwanted distorted photoresist images over non-planar portions of the substrates. Likewise, anisotropic etching to pattern the various conducting layers over the non-planar surface can result in residue on the sidewalls of the underlying patterns which can lead to intra-level shorts. In addition, thinning of narrow inter-connecting metal lines over steps in underlying patterned layers can result in low yield and early failure of the circuit. This is especially true at high current densities where electromigration of the metal atoms in the line can lead to voids and open lines or can result in extrusion of metal between the closely spaced lines leading to shorts.

One approach of minimizing these topographic problems is to provide processes that preserve the planar nature of the substrate surface for receiving the next level of patterned layers. This planarization requirement is particularly important at the multilayer metallurgy levels, where the roughness of the surface topography can be quite severe.

Varies methods have been used for planarizing the dielectric layers that physically and electrically isolate these conducting metal layers. For example, some methods for forming planarized insulating layers over this rough topography include depositing bias sputtered silicon oxide, depositing and flowing of doped CVD oxides, such as phosphosilicate glass (PSG) and borophosphosilicate glass (BPSG), biased plasma enhanced CVD (PECVD) and similar techniques. However, many of these techniques are time consuming and require costly process equipment.

More recently, new techniques using spin-on-glasses are finding increasing use for forming interlevel insulator that can be planarized. This type of glass is of particular interest because the deposition process and planarization is relatively simple and the process utilizes low cost equipment. For example, the insulating layer is deposited by spin coating of a liquid precursor, similar to the spin application of photoresist. The layer is then dried to remove the solvents and baked on a hot plate or in a oven to cure the layer and to form an inorganic oxide by pyrolysis. For example, D. L. Yen U.S. Pat. No. 5,003,062 describes a method for forming a multilayer metallurgy using a spin-on-glass layer as part of the planarized insulating layer.

The formation of these planar insulating layers generally require the need of several spin-on-glass applications and bakes in order to achieve the necessary planarity. The spin-on-glass also suffers from other limitation when the coating material is dispensed on the wafer. For example, in the static dispense method, when the liquid is dispensed at zero wafer rotation and then the wafer is accelerated to high rotational speed the spin-on-glass layer can develop wave and crown like structures, while in the dynamic dispense method when the liquid is dispensed at low rotation speed and then the wafer is accelerated to high rotational speeds, striations can occur causing grooves or channels to appear near wafer edge. Also topographic features on the wafer can cause radial streaks to occur on the wafer. One approach for eliminating this problem was described by A. K. Weiss et al U.S. Pat. No. 4,971,931, in which a diffuser feature is provided on the wafer to disperse the liquid precursor.

When the patterned structure on the wafer surface in irregular in width or height, the recesses or cavities have aspect ratios which vary significantly. This is usually the case for the patterned conducting layers and as a result the coating of the wafer with spin-on-glass is further complicated. The aspect ratio being defined as the ratio of the height to the width of a recess or gap. For example, with the current trend in ULSI to even smaller image sizes, the aspect ratio for recesses between metal lines can approach 3:1. At conventional high spin speeds for coating the spin-on-glass, recesses having various aspect ratios do not consistently fill the same, making the planarization process more difficult. Therefore, there is strong need for planarizing process techniques which are less sensitive to the pattern geometry and therefore, the aspect ratio.

SUMMARY OF THE INVENTION

It is a principle object of this invention to provide a method for forming an improved planarized dielectric layer over substrates having irregular surface topography with micrometer and submicrometer feature sizes. The planarization process of this invention referred to as Aspect-Ratio-Independent-Coating Spin-On-Glass (ARIC SOG) is used to fill the recesses irrespective of variations in the aspect ratios.

It is another object of this invention to provide a method which eliminates the striation that occur at high spin speeds and to provide a simplified process that reduces the cost and improves the product throughput over more conventional spin-on-glass processes.

In accordance with the present invention, a method is described for planarizing a dielectric layer over patterned conducting layer that are used as interconnections for semiconductor devices on integrated circuits. The method start by first providing a semiconductor substrate which has devices, such as field effect transistor (FET) or bipolar transistors formed therein. An insulating layer is deposited on the substrate and contact openings are then etched in the insulating layer to make electrical contacts to desired devices. A patterned conducting layer is then formed over the substrate making contact to the devices and thereby providing the interconnecting wiring for the desired integrated circuits. Typically the contacts have deposited on them a barrier metal, such as a refractory metal. This barrier metal layer prevents metal from the aluminium or aluminium alloy conducting layer from penetrating into the semiconductor contact and degrading the device performance or completely destroying the device.

The ARIC SOG planarizing dielectric layer is formed next. However, before coating the substrate with the spin-on-glass a protective insulating layer, such as silicon oxide is deposited over the patterned conducting layer to prevent the spin-on-glass from contacting and eroding the conducting layer. The conducting layer is typically an aluminium or aluminium alloy. This oxide layer also provides for better adhesion of the spin-on-glass and minimizes the formation of hillocks on the patterned aluminium layer. The protective silicon dioxide layer can be deposited, for example, by using a conventional plasma enhanced chemical vapor deposition (PECVD) process.

The spin-on-glass is now coated on the substrate by spinning or rotating the substrate and dispensing a liquid precursor containing one of the siloxane types. The details of the process for coating the spin-on-glass on the substrate to form the improved planar dielectric layer is very important and is the major object of this invention. In order to provide an aspect ratio independent coating and to avoid the presents of striations on the substrate this invention teaches a two step process, wherein the first spin-on-layer is coated at a low and constant spin speed which is then dried and baked and then by applying a second spin-on-glass coating at a constant but much higher spin speed followed by a curing step to form the inorganic glass.

This two step process, referred to in the invention as an Aspect-Ratio-Independent-Coating Spin-On-Glass (ARIC SOG) provides an improved and essentially more planar dielectric layer than can be otherwise obtained using a more conventional process. For example, conventional processes that use a three step spin coating process at high spin speed or a multi-step process which relies on rotation acceleration of the substrate during the dispensing of the liquid precursor. The process also eliminates striations by avoiding an initial high spin speed coating as the first coating and reduces cost by providing the same dielectric layer thickness as the three step process but with less processing steps.

BRIEF DESCRIPTION OF THE DRAWINGS

The object and other advantages of this invention are best explained in the preferred embodiment with reference to the attached drawing that include:

FIG. 3A and FIG. 3B shows the gap filling at the low spin speed for a low and high aspect ratio recess, respectively and FIG. 4A and FIG. 4B shows the planarization after the high spin speed coating for both a low and high aspect ratio recess, respectively.

DESCRIPTION OF THE PREFERRED EMBODIMENTS

Although the embodiment of this invention describes the method of forming a single planarized dielectric layer over a single patterned conducting layer, it should be well understood by one skilled in the art that by forming another patterned conducting layer over the first planar dielectric layer having via holes or conducting studs formed therein, and utilizing again the planarizing process of this invention, that a second conducting interconnecting layer can be formed having a planar dielectric layer thereon. This process can be repeated several times so as to form a planar multilayered metallurgy necessary for wiring up the discrete devices on the substrate of ULSI integrated circuit.

Figure 1:
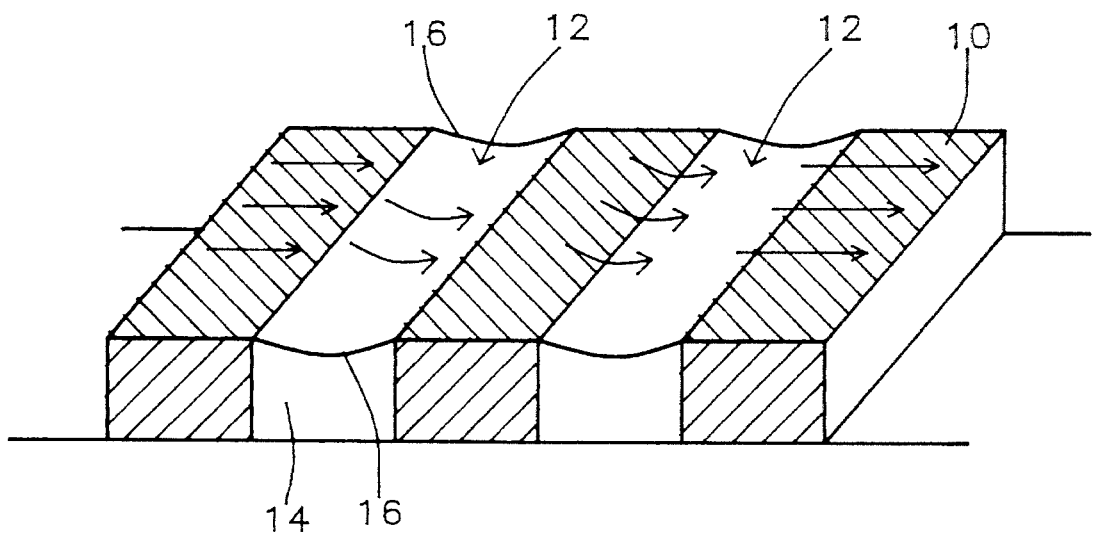
FIGS. 1 and 2 illustrate schematically in a three dimensional view the dependence of the spin-on-glass filling in a low and high aspect ratio recess or gap for a conventional high spin speed coating.
Figure 2:
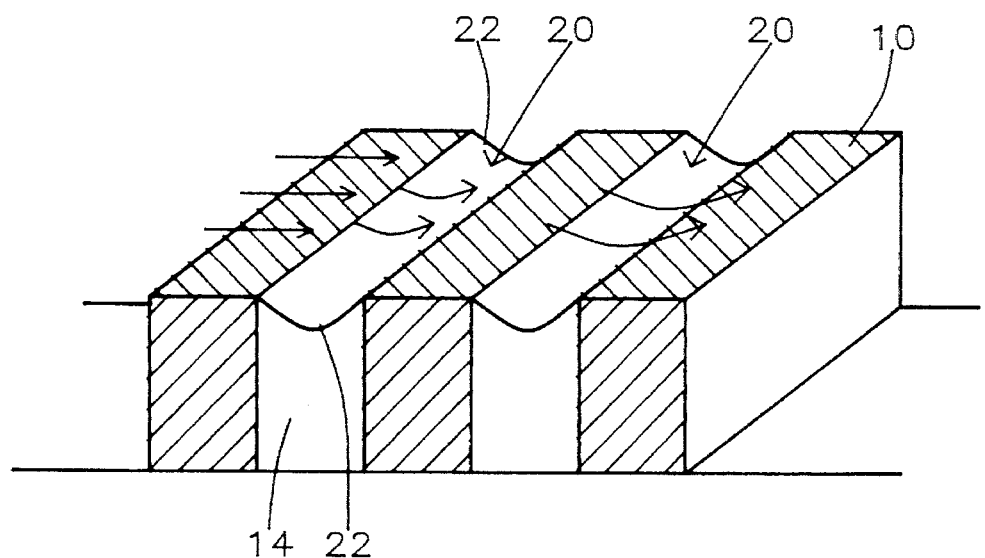

Referring now to FIGS. 1 and 2, the characteristics of a conventional method of filling a recess or gap by dispensing a spin-on-glass liquid precursor at high spin speeds is shown. The filling characteristic are compared for a low aspect ratio recess, as shown in FIG. 1 and for a high aspect ratio recess, as shown in FIG. 2. The arrows in both FIG. 1 and FIG. 2 depict the mass transport of spin-on-glass flowing across the surface of a substrate having recess formed therein and at the same process conditions. As can be seen in FIG. 1 for a low aspect ratio recess, the spin-on-glass 14 fills the recess 12 having a shallow concave shape 16 at the surface. However, as seen in FIG. 2, the fill conditions are quite different when the width of the recess narrows and the aspect ratio is high. Under similar spin conditions the spin-on-glass 14, in the high aspect ratio recess 20, fills the recess forming a significantly deeper concave surface 22 in the spin-on-glass 14. This aspect ratio dependent filling of recesses makes it difficult to form a planar dielectric layer over patterned layer on the same substrate having recesses with significantly differing aspect ratios. This large variation in aspect ratio is usually present on the patterned metal wiring 10 that is used to interconnect the discrete devices on integrated circuits. As down scaling continues, the occurrence of high aspect ratio recess will continue to increase as spacings between conducting metal line diminish and become submicrometer in size.

Figure 3A:
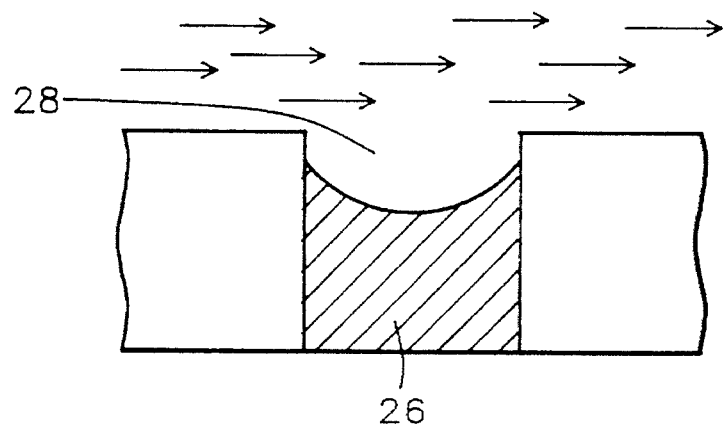
FIGS. 3A, 3B and FIGS. 4A, 4B illustrate schematically the cross-section representation of the two step process of this invention for planarizing, using the Aspect Ratio Independent Coating Spin-On-Glass (ARIC SOG) process.
Figure 3B:
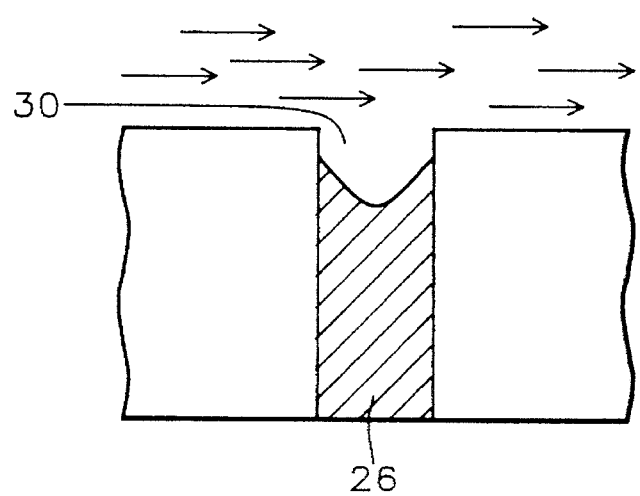
Figure 4A:
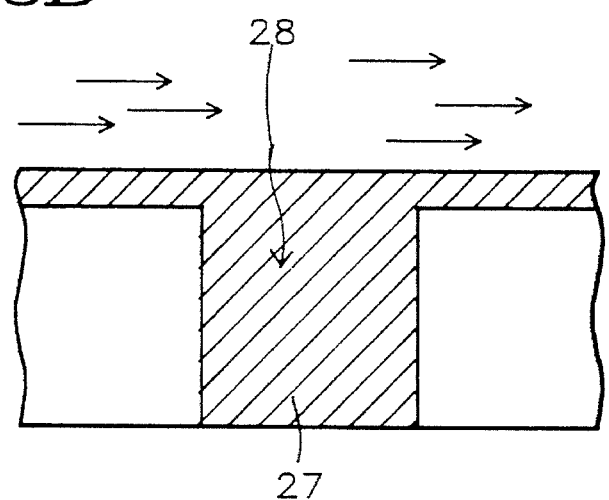
Figure 4B:
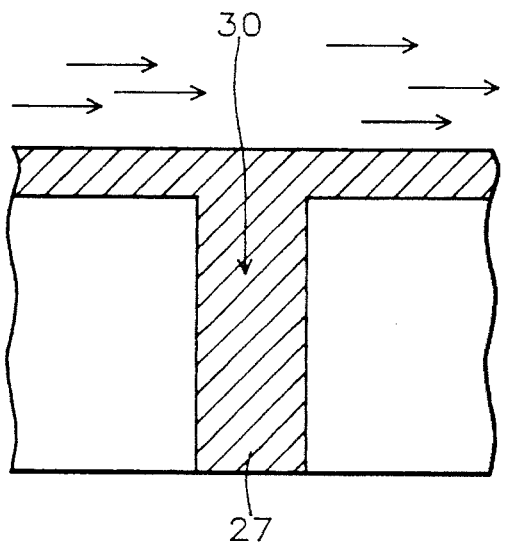

Referring now to FIGS. 3A, 3B and to FIGS. 4A, 4B, a process for forming the improved planarized dielectric layer using the method of this invention, referred to as the ARIC SOG process, is described in some detail. The ARIC SOG process is a two step process in which the first spin-on-glass is coated on the substrate at a constant and low spin speed, for example at between about 600 to 800 revolutions per minute (rpm) and the second coating is spun on at a constant and high spin speed, for example, at between about 2500 to 3500 rpm and more specifically at 3000 rpm.

As shown in FIG. 3A, for the low aspect ratio recess, for example, having an aspect ratio less than one and as shown in FIG. 3B, for a high aspect ratio recess, the spin-on-glass 26 applied at low spin speeds fills more evenly both the low and high aspect ratio recesses 28 and 30 shown, respectively, in FIGS. 3A and 3B.

Now referring to FIGS. 4A and 4B, the second step of the ARIC SOG process which completes the planarization is shown. Because the recesses are more evenly filled in the first spin-on-glass step the second application of the spin-on-glass at a constant but high spin speed results in more effectively planarizing the spin-on-glass over recesses having significantly differing aspect ratios. As shown in FIG. 4A for the low aspect ratio recess 28 and as shown in FIG. 4B, for the high aspect ratio recess 30, the ARIC SOG process effectively planarizes the spin-on-glass 27 on the same substrate at the same time for recesses having widely varying aspect ratios. This is exceptionally important in the semiconductor industry where spacings on patterned layers can vary significantly on substrate.

Figure 5:
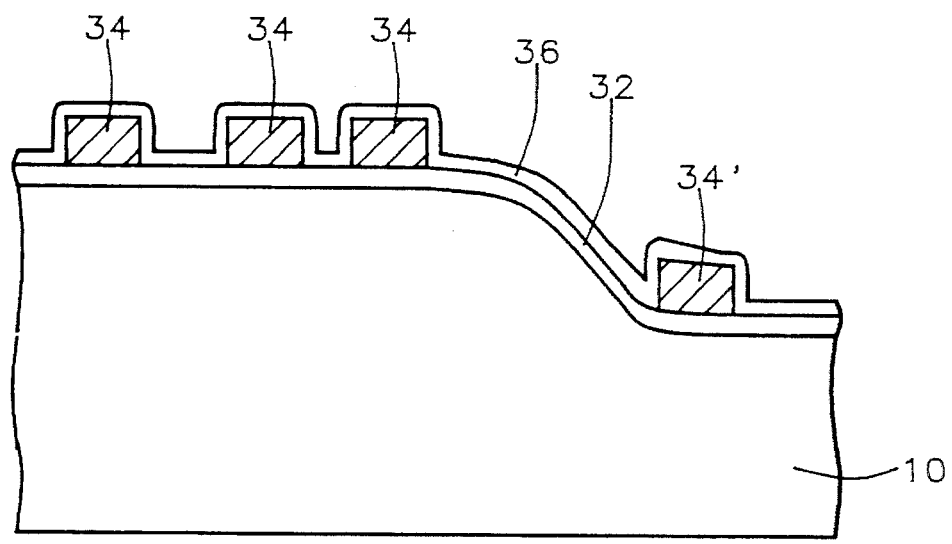
FIGS. 5, 6 and 7 illustrate schematically the cross sectional representation of a semiconductor substrate having the planar dielectric layer formed by the ARIC SOG process of this invention.
Figure 6:
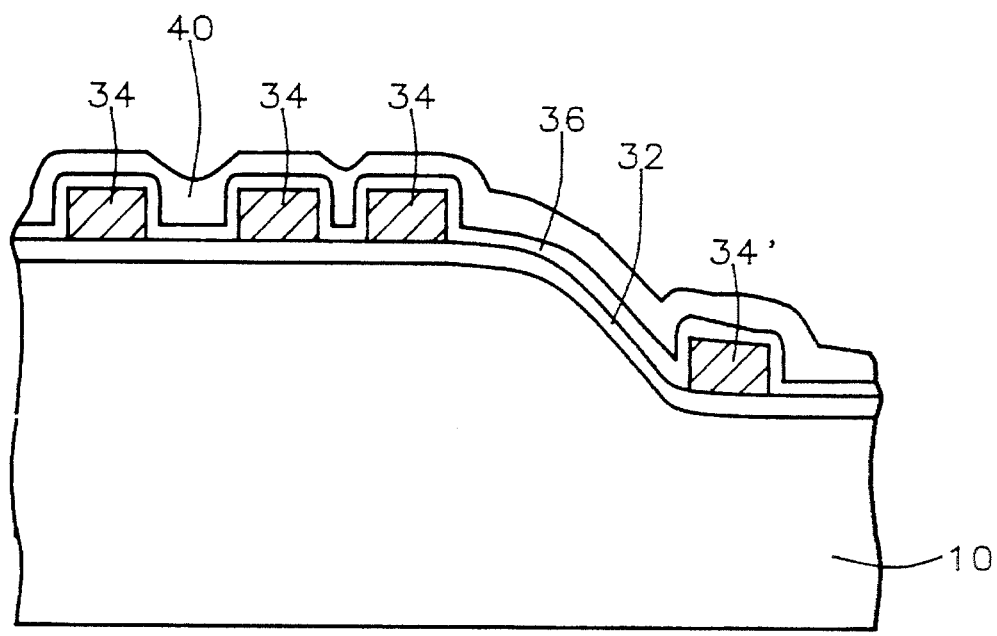
Figure 7:
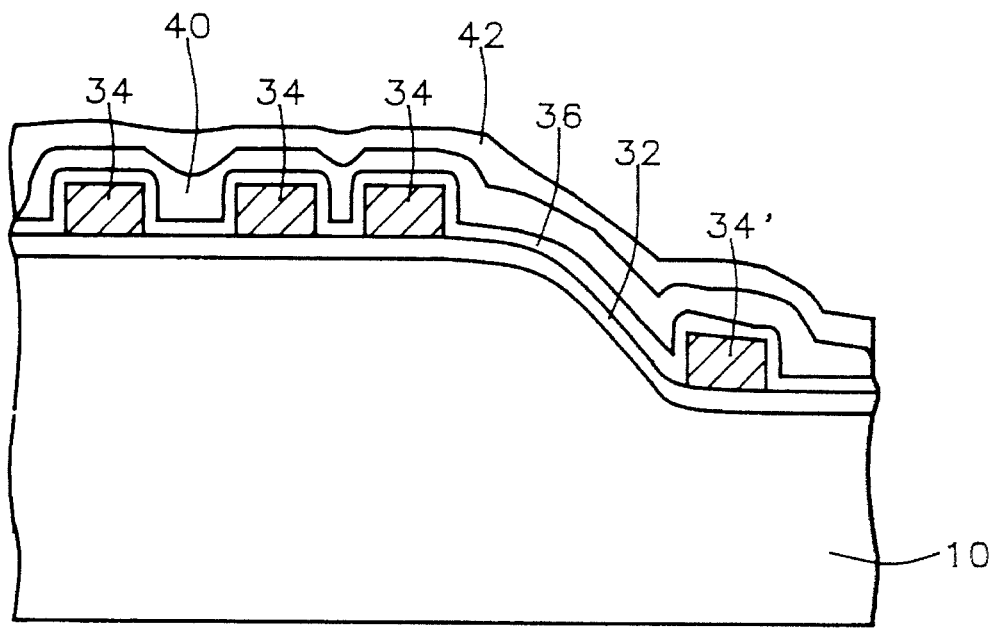

Referring now more particularly to FIGS. 5 through 7, the method is shown for forming this improved planarized dielectric layer over patterned metal layer formed on a substrate. As shown in FIG. 5, a substrate 10, for example, composed of single crystal silicon is used having devices such as field effect and bipolar transistors formed therein. Also formed on the substrate surface are patterned polysilicon layers or silicide layers forming portions of the device and also serving as conducting layers. These device and polysilicon layers are not explicitly shown in FIGS. 5 through 7 for simplicity, since they are not critical to the description of the invention. An insulating layer 32 is deposited thereon by conventional means. For example, the insulating layer can be composed of silicon dioxide and silicon nitride and deposited using chemical vapor deposition (CVD) or low pressure chemical vapor deposition (LPCVD).

The patterned conducting layer 34 is then formed over the insulating layer 32 and making contact through opening in layer 32 so as to provide for the electrical wiring of devices on the substrate. The conducting layer 34, such as aluminium or aluminium alloy, is deposited by conventional means using sputter deposition or physical evaporation. The conducting layer 34 is then patterned by using conventional photolithographic techniques and plasma etching. For example, the aluminium metallurgy can be etched in a low pressure reactive ion etching using a gas mixture containing a chlorine species. The preferred thickness of this conducting layer 34 is preferably between about 6000 to 9000 Angstroms. In present day ultra large semiconductor integration (ULSI) the spacing between these patterned conducting regions can vary considerably. For example, the spacing can vary from well over a micrometer to less than 0.5 micrometer and the aspect ratio of these spacings, which is the ratio of the height to the spacing between metal lines can be greater than 2.

The formation of the planarized dielectric layer using the ARIC SOG process is now formed over the patterned conducting metal layer 34 after first depositing a insulating barrier layer 36. The insulating layer 36 for example, can be silicon dioxide and be deposited by plasma enhanced chemical vapor deposition (PECVD). This silicon dioxide layer 36 should be sufficiently thick to provide a barrier between the conducting metal layer 34 and the spin-on-glass which is deposited next by spin coating. The barrier layer 36 prevent the spin-on-glass from contacting and eroding the metal conducting layer 34. The preferred thickness of the insulating layer 36 is between about 2000 to 4000 Angstroms.

Now referring to FIG. 6, a first spin-on-glass layer 40 is formed over the insulating layer 36 by spin coating. The preferred material used is a spin-on-glass liquid which consist of a silicon-oxide (Si—O) network polymer dissolved in a common organic solvent, such as alcohol, ketones and esters. And more specifically the preferred spin-on-glass material is a series of siloxane base material marketed by the Allied-Signal Corp. under the trade name ACCUGLASS. The preferred material in the series being ACCUGLASS 211, 314 or 311. The primary difference between the spin-on-glass types is the viscosity (solid content). For example, the series 211 has a lower viscosity and produces a thinner coating of about 2000 Angstroms while series 314 and 311 have a higher viscosity and produce coatings of about 3000 Angstroms.

Referring now more particularly to the method of coating the substrate to form the planarizing dielectric layer over the patterned conducting layer, a first spin-on-glass coating 40, is formed by first bringing the substrate to a constant rotational speed in the range of about 600 to 800 revolutions per minute (rpm) and then dispensing the spin-on-glass liquid precursor for about 6 seconds. The spin-on-glass is then allowed to air dry at room temperature of about 25° C. for another 15 second at the above constant rotational speed. The substrate is then removed from the spin coater and baked, for example on a hot plate, at a temperature of between about 100 to 300 for a time of between 0.5 to 2.0 minutes. Because of this lower and constant spin speed the recesses or gaps between the patterned conductor 34 fill more evenly, as was depicted earlier in FIGS. 3A and 3B.

Referring next to FIG. 7, a second spin-on-glass layer 42 is now formed over the first spin-on-glass layer 40 essentially planarizing the dielectric layer and completing the process. This second spin-on-glass layer 42 is formed by also using the liquid precursor of the siloxane type similar in composition to the material used for the first spin-on-glass layer 40, but in this second coating the spin-on-glass is dispensed at a significantly higher spin speed and at a constant speed. The same series of spin-on-glass is used for both layers.

The substrate is again placed on a spin coater and brought to a constant rotational speed in the range of about 2500 to 3000 revolutions per minute (rpm) before dispensing the spin-on-glass and then the substrate is maintained at this constant rotational speed for an additional 6 seconds. The substrate is then brought to a stationary position, that is the spin speed is reduced to zero rpm and the second spin-on-glass layer is allowed to air dry at room temperature of about 25° C. for an additional 15 seconds. The substrate is then baked, for example on a hot plate, at a temperature of between about 100° to 300° C. for a time of between about 0.5 to 2.0 minutes. The spin-on-glass layer 42 is then pyrolzed at a relatively high temperature to form an inorganic glass. The preferred curing temperature for this last step is between about 400° to 450° C. and for a time of about 20 to 30 minutes, and more specifically at a temperature of 425° C. for 30 minutes thereby forming the inorganic glass. The preferred thickness of layer 42 is between about 4000 to 6000 Angstroms. as can be seen in FIG. 7, the spin-on-glass dielectric layer fills the recesses and essentially planarizes the irregular recesses or gaps on the substrate.

Also shown in FIGS. 5 through 7 is an isolated metal line 34' on a portion of the substrate which is lower than the remaining substrate surface. Generally, these types of non-planarities can arise from previous substrate processing. The processes responsible for a non-planar surface is not explicitly shown for simplicity and are not essential to the invention. This isolated metal line and the planarized dielectric layer formed there on show the planarizing effect of the spin-on-glass process for metal patterns or other isolated structure, even if the substrate itself is non-planar.

Although this embodiment describes a process for forming a single planar dielectric layer over a single patterned conducting layer, it should also be well understood by one skilled in the art that the process can be repeated to form additional patterned metal layers having planarized dielectric layer formed thereon. This can be accomplished by first depositing a second insulating barrier layer over the cured second spin-on-glass layer 42, forming via hole openings in the planar dielectric layer to the underlying conducting layer and then depositing a second conducting layer, such as aluminium, which contacts the first conducting layer through the via holes. The conducting layer can then be patterned by reactive ion etching and then planarizing process ARIC SOG of this invention can be used to planarize the second level metal. By repeating this process by the above method a multilayered metallurgy can be fabricated.

While the invention has been particularly shown and described with reference to the preferred embodiments thereof, it will be understood by those skilled in the art that various changes in form and details may be made without departing from the spirit and scope of the invention.

What is claimed is:

1. A method for forming a planarized dielectric layer over a substrate having a patterned conducting layer comprising the steps of:
   providing a semiconductor substrate having semiconductor devices formed in and on said substrate and having a patterned conducting layer formed thereon;
   depositing an insulating layer on said semiconductor devices and said patterned conducting layer;
   coating said insulating layer with a first spin-on-glass layer dispensed at a first and constant spin speed of between about 600 to 800 revolutions per minute (rpm) and thereby partially filling recesses formed by said patterned conducting layer on said substrate;
   baking said first spin-on-glass layer at an elevated temperature, and out gassing said first spin-on-glass layer;
   coating a second spin-on-glass layer on said first spin-on-glass layer, dispensed at a second and constant spin speed greater than the first spin-speed and thereby filling completely said recesses formed by said patterned conducting layer and forming an essentially planar second spin-on-glass layer over said patterned conducting layer;
   curing said second spin-on-glass layer at an elevated temperature to pyrolize said second spin-on-layer forming an inorganic glass layer and completing said planar glass layer over patterned conducting layer.

2. The method of claim 1, wherein said insulating layer is deposited by plasma enhanced chemical vapor deposition and having a thickness from about 2000 to 4000 Angstroms.

3. The method of claim 1, wherein said first spin-on-glass is dispensed for about 6 seconds and dried for 15 seconds at said spin speed at about 25° C.

4. The method of claim 3, wherein said first spin-on-glass layer is baked at a temperature of between about 100° to 300° C. and having a thickness range of about 2000 to 4000 Angstroms.

5. The method of claim 1, wherein said second spin-on-glass layer is dispensed at a second wafer spin speed of between about 2500 to 3000 revolutions per minute (rpm) for about 6 seconds and dried for 15 seconds at zero spin speed at about 25° C.

6. The method of claim 5, wherein said second spin-on-glass layer is cured at a temperature of between about 100° to 300° C. and having a thickness range of about 2000 to 2500 Angstroms.

7. The method of claim 1, wherein said first and second spin-on-glass layers are of the siloxane type.

8. A method for forming a planarized dielectric layer over a substrate having a patterned conducting layer comprising the steps of:
   providing a semiconductor substrate having semiconductor field effect transistors formed in and on said substrate and having a patterned conducting layer formed thereon;
   depositing an insulating layer on said semiconductor devices and said patterned conducting layer;
   coating said insulating layer with a first spin-on-glass layer dispensed at a first and constant spin speed of between about 600 and 800 revolutions per minute (rpm) and thereby partially filling recesses formed by said patterned conducting layer on said substrate;
   baking said first spin-on-glass layer at an elevated temperature, thereby out gassing said first spin-on-glass layer;
   coating a second spin-on-glass layer on said first spin-on-glass layer, dispensed at a second and constant spin speed greater than the first spin speed and thereby filling completely said recesses formed by said patterned conducting layer and forming an essentially planar silicon oxide surface over said patterned conducting layer;
   curing said second spin-on-glass layer at an elevated temperature to pyrolize said second spin-on-layer forming an inorganic glass layer and completing said planar glass layer over said patterned conducting layer.

9. The method of claim 8, wherein said insulating layer is deposited by plasma enhanced chemical vapor deposition and having a thickness from about 4000 to 6000 Angstroms.

10. The method of claim 8, wherein said first spin-on-glass layer is dispensed for about 6 seconds and dried for 15 seconds at said spin speed at about 25° C.

11. The method of claim 10, wherein said first spin-on-glass layer is baked at a temperature of between about 100° to 300° C. and having a thickness range of between about 4000 to 6000 Angstroms.

12. The method of claim 8, wherein said second spin-on-glass layer is dispensed at a second wafer spin speed of between about 2500 to 3000 revolutions per minute (rpm) for about 6 seconds and dried for 15 seconds at zero spin speed at about 25° C.

13. The method of claim 12, wherein said second spin-on-glass layer is cured at a temperature of between about 100° to 300° C. and having a thickness range of between about 2000 to 2500 Angstroms.

14. The method of claim 8, wherein said first and second spin-on-glass layers are of the siloxane type.

15. A method for forming a planarized dielectric layer over a substrate having at least one patterned conducting layer comprising the steps of:
   providing a semiconductor substrate having bipolar transistors formed in and on said substrate and having at least one patterned conducting layer formed thereon;
   depositing an insulating layer on said semiconductor devices and said patterned conducting layer;
   coating said insulating layer with a first spin-on-glass layer dispensed at a first and constant spin speed of between about 600 to 800 revolutions per minute (rpm); and thereby partially filling recesses formed by said patterned conducting layer on said substrate;

baking said first spin-on-glass layer at an elevated temperature, and out gassing said first spin-on glass layer;

coating a second spin-on-glass layer on said first spin-on-glass layer, dispensed at a second and constant spin speed greater than the first spin speed and thereby filling completely said recesses formed by said patterned conducting layer and forming an essentially planar second spin-on-glass layer over said patterned conducting layer;

curing said second spin-on-glass layer at an elevated temperature to pyrolize said second spin-on-glass layer forming an inorganic glass layer and completing said planar glass layer over patterned conducting layer.

16. The method of claim 15, wherein said insulating layer is deposited by plasma enhanced chemical vapor deposition and having a thickness from between about 2000 to 4000 Angstroms.

17. The method of claim 15, wherein said first spin-on-glass is dispensed for about 6 seconds and dried for 15 seconds at said spin speed at about 25° C.

18. The method of claim 17, wherein said first spin-on-glass layer is baked at a temperature of between about 100° to 300° C. and having a thickness range of between about 2000 to 4000 Angstroms.

19. The method of claim 15, wherein said second spin-on-glass layer is dispensed at a second wafer spin speed of between about 2500 to 3000 revolutions per minute (rpm) for about 6 seconds and dried for 15 seconds at zero spin speed at about 25° C.

20. The method of claim 19, wherein said second spin-on-glass layer is cured at a temperature of between about 100° to 300° C. and having a thickness range of between about 2000 to 2500 Angstroms.

21. The method of claim 15, wherein said first and second spin-on-glass layers are of the siloxane type.

* * * * *